US009741676B1

United States Patent
Luo et al.

(10) Patent No.: US 9,741,676 B1
(45) Date of Patent: Aug. 22, 2017

(54) TIN-INDIUM BASED LOW TEMPERATURE SOLDER ALLOY

(71) Applicant: Indium Corporation, Clinton, NY (US)

(72) Inventors: Jianguo Luo, New Hartford, NY (US); Ning-Cheng Lee, New Hartford, NY (US)

(73) Assignee: Indium Corporation, Utica, NY (US)

( * ) Notice: Subject to any disclaimer, the term of this patent is extended or adjusted under 35 U.S.C. 154(b) by 0 days.

(21) Appl. No.: 15/192,770

(22) Filed: Jun. 24, 2016

(51) Int. Cl.

| | |
|---|---|
| ***C22C 13/00*** | (2006.01) |
| ***H01L 23/00*** | (2006.01) |
| ***B23K 35/26*** | (2006.01) |
| ***H01B 1/02*** | (2006.01) |
| *B23K 101/40* | (2006.01) |

(52) U.S. Cl.

CPC ............ *H01L 24/16* (2013.01); *B23K 35/262* (2013.01); *C22C 13/00* (2013.01); *H01B 1/023* (2013.01); *H01B 1/026* (2013.01); *H01L 24/81* (2013.01); *B23K 2201/40* (2013.01); *H01L 2224/16227* (2013.01); *H01L 2224/81125* (2013.01); *H01L 2224/81815* (2013.01); *H01L 2924/0103* (2013.01); *H01L 2924/014* (2013.01); *H01L 2924/0105* (2013.01); *H01L 2924/01016* (2013.01); *H01L 2924/01029* (2013.01); *H01L 2924/01047* (2013.01); *H01L 2924/01049* (2013.01); *H01L 2924/3511* (2013.01)

(58) Field of Classification Search

CPC ..................... H01L 24/16; H01L 24/81; H01L 2224/16227; H01L 2224/81125; H01L 2224/81815; H01L 2924/01016; H01L 2924/01029; H01L 2924/0103; H01L 2924/01047; H01L 2924/01049; H01L 2924/0105; H01L 2924/014; H01L 2924/3511; B23K 35/262; B23K 2201/40; C22C 13/00; H01B 1/023; H01B 1/026

USPC .................................. 257/737; 420/560, 561

See application file for complete search history.

(56) References Cited

U.S. PATENT DOCUMENTS

| | | | | |
|---|---|---|---|---|
| 5,953,623 | A * | 9/1999 | Boyko | H01L 24/13 257/E21.511 |
| 6,176,947 | B1 * | 1/2001 | Hwang | B23K 35/262 148/400 |
| 2005/0056687 | A1 * | 3/2005 | Matsumoto | B23K 35/025 228/248.1 |
| 2006/0104855 | A1 * | 5/2006 | Rothschild | B23K 35/262 420/560 |
| 2008/0292493 | A1 * | 11/2008 | Lee | B23K 35/262 420/561 |

* cited by examiner

*Primary Examiner* — Cuong Q Nguyen
*Assistant Examiner* — Tong-Ho Kim
(74) *Attorney, Agent, or Firm* — Sheppard Mullin; Daniel Yannuzzi; Jonathan Marina

(57) ABSTRACT

A lead-free solder alloy having a low melting temperature and low yield strength is disclosed. The solder alloy includes 5.0-20.0 wt. % of indium (In), 1.0-5.0 wt. % of silver (Ag), 0.25-2.0 wt. % of copper (Cu), 0.1-0.5 wt. % of zinc (Zn), and a remainder of tin (Sn). In implementations, a sulfur compound may be included in a concentration of 100 ppm to 500 ppm in the alloy to prevent oxidation of zinc and indium on the surface of the alloy. The solder alloy is particularly useful for but not limited to solder on pad applications in first level interconnect semiconductor device packaging.

20 Claims, 4 Drawing Sheets

Stress (MPa)
60
50
40
30
20
10
0
Y
M
B
Br
0 1 2 3 4 5 6 7 8 9 10 11 12 13 14 15 16 17 18 19 20 21 22
Strain (%)

TIN-INDIUM BASED LOW TEMPERATURE SOLDER ALLOY

TECHNICAL FIELD

The present disclosure relates generally to lead-free soldering alloy compositions for use in electronics and, in particular, to a lead-free soldering alloy made of tin, indium, silver, copper, and zinc.

DESCRIPTION OF THE RELATED ART

Due to environmental and health concerns in the past ten years, semiconductor industries have been widely adopting lead (Pb) free solder alloys, including converting tin-lead solder alloys (e.g., Sn63Pb37, Pb95Sn5) to lead free solders. Among lead free tin-based solder alloys, Sn—Ag—Cu alloys, Sn—Zn alloys, Sn—Ag—In alloys, and Sn—Ag—Cu—In alloys have shown promise. However, these alloys either have a high liquidus temperature, exhibit too great a yield strength and brittleness, or both. In cases where the alloys have too high a liquidus temperature, thermal damage may be caused to electronic components and printed wiring boards (PWB) during soldering, causing yield loss and reducing component reliability.

In cases where alloys exhibit too great a yield strength and brittleness, they are unsuitable for next generation electronic and semiconductor devices packaging. Next generation electronic and semiconductor devices employ brittle and porous low dielectric materials in silicon chips. These devices require the ability to withstand significant impact and mechanical shock due to the increasing popularity of portable electronic devices, such as cellular phones, personal data assistants (PDA), laptop computers, etc.

For example, the first level interconnect (FLI) of current semiconductor devices uses lead-free high temperature solder alloys of SAC (tin-silver-copper), Sn0.7Cu, or Sn1.0Cu with a surface mount technology (SMT) reflowing peak temperature of 250° C. or above. Due to overheating during the high temperature reflowing process, the semiconductor device (chip) experiences significant warpage, usually up to 100 microns to 200 microns. The warpage caused by the high temperature reflow process creates several surface mounting defects, such as, for example: non-wet open (NWO) defects, Head-on-pillow (HoP) defects, solder bridging, etc.

In view of the foregoing issues, there is a need for a lead-free solder alloy that has a low liquidus temperature and may be used in demanding applications with a compliance that is comparable to that of lead containing solder alloys.

BRIEF SUMMARY OF EMBODIMENTS

A lead-free solder alloy having a low melting temperature and low yield strength is disclosed. The solder alloy includes 5.0-20.0 wt. % of indium (In), 1.0-5.0 wt. % of silver (Ag), 0.25-2.0 wt. % of copper (Cu), 0.1-0.5 wt. % of zinc (Zn), and a remainder of tin (Sn). In implementations, a sulfur compound may be included in a concentration of 100 parts per million (ppm) to 500 ppm in the alloy to prevent oxidation of zinc and indium on the surface of the alloy. The solder alloy is particularly useful for but not limited to solder on pad applications in first level interconnect semiconductor device packaging.

In a particular embodiment, the solder alloy consists essentially of: a sulfur compound having a concentration of 100 ppm to 500 ppm in the solder alloy; 10.0-15.0 wt. % of In; 2.0-3.8 wt. % of Ag; 0.5-1.0 wt. % of Cu; 0.1-0.25 wt. % of Zn; and a remainder of Sn. In one embodiment, the solder alloy may be used to form a solder joint by placing a soldering material onto a metal pad of a substrate, where the soldering material includes the solder alloy; and reflow soldering the substrate to form the solder joint.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the included figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

In accordance with various embodiments, a lead-free solder alloy having a low melting temperature and low yield strength is disclosed. The disclosed solder alloy, in various embodiments, has a low melting temperature range (e.g., between 160° C. and 210° C.) and high compliance due to low tensile strength and yield strength. The disclosed solder alloy is suitable for, but not limited to, producing solder joints, in the form of solder preforms, solder balls, solder powder, or solder paste (a mixture of solder powder and flux), for electronics applications.

In various embodiments, the solder alloy comprises 5.0-20.0 wt. % of indium (In), 1.0-5.0 wt. % of silver (Ag), 0.25-2.0 wt. % of copper (Cu), 0.1-0.5 wt. % of zinc (Zn), and a remainder of tin (Sn). In particular embodiments, the solder alloy consists essentially of 10.0-15.0 wt. % of In, 2.0-3.8 wt. % of Ag, 0.5-1.0 wt. % of Cu, 0.1-0.25 wt. % of Zn, and a remainder of Sn.

In embodiments, a sulfur compound (e.g., $Cu_2S$ or CuS) may be added to the alloy to prevent oxidation of zinc and indium on the surface of the alloy. As further described below, embodiments of the disclosed solder alloy may provide the following benefits: a low melting temperature range (e.g., between 160° C. and 210° C.), low yield strength (e.g., a yield strength between 15 MPa and 40 MPa), and improved solder alloy reliability. In particular embodiments, the disclosed solder alloy may have a melting temperature range between 180° C. and 205° C. and a yield strength between 16 MPa and 22 MPa.

Before describing experimental results illustrating the improved properties of joints formed using the solder alloy disclosed herein, it is instructive to describe the benefits of the solder alloy disclosed herein.

Figure 1:
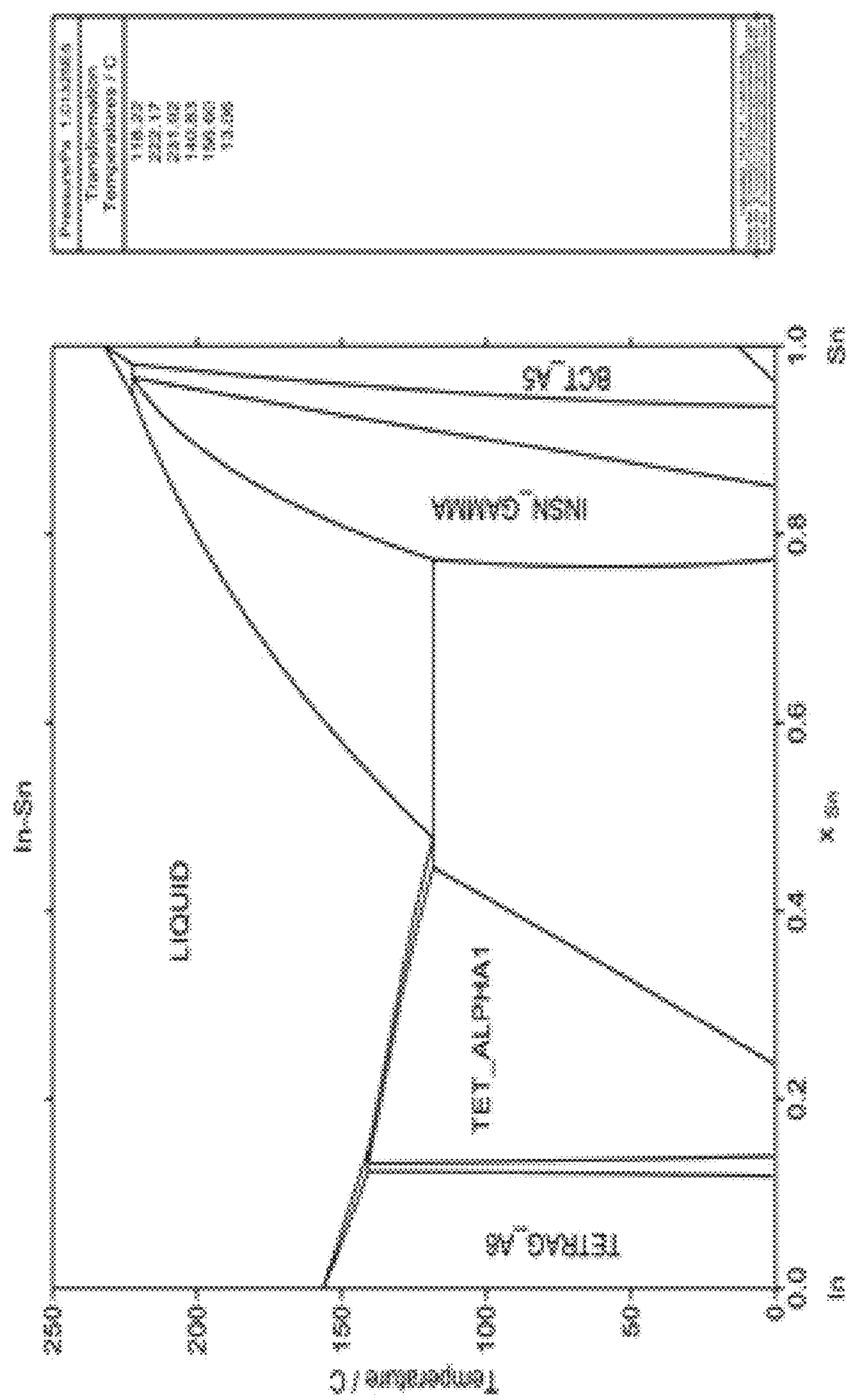
FIG. 1 shows an In—Sn binary phase diagram illustrating various phases of an Sn—In alloy.

FIG. 1 shows an In—Sn binary phase diagram illustrating various phases of the Sn—In alloy. As shown, in order to meet a melting temperature range of between 160° C. and 210° C. and low yield strength of between 15 MPa and 40 MPa, focus is placed on the tin-rich (right side) of the diagram where the liquidus temperature is above 150° C. Where the ratio of indium to tin is 20/80 by weight or greater, there is a high probability of forming an Sn—In eutectic phase with solidus temperature of around 118° C., which severely limits the application of the solder alloy and significantly decreases its reliability. On the other hand, where the ratio of indium to tin is 5/95 by weight or less, the liquidus temperature of the solder alloy approaches 225° C., which is unsuitable for achieving a melting temperature range of between 160° C. and 210° C., even if the Sn—In alloy is doped with multiple elements. Accordingly, embodiments of the solder alloy disclosed herein are chosen such that the ratio in wt % of indium to tin is between about 5/95 and 20/80, and preferably 10/90 and 15/85. It was found by the inventors that indium underwent a martensitic transformation that provided ductile interconnects among the tin grain boundaries.

The solder alloy disclosed herein is doped with silver, copper, and zinc to achieve the following unexpected and positive results. First, it was found by the inventors that the melting temperature range (solidus and liquidus temperature) may be tuned by silver, copper, and zinc doping as follows. It was found that silver and copper may be added to react with tin to form ternary Sn—Ag—Cu eutectic compounds, which may increase the solidus temperature and decrease the liquidus temperature of the alloy, thereby narrowing the melting temperature range. It was additionally found that zinc may be added to react with tin to form a eutectic phase with a melting temperature of 197° C., which may further decrease the liquidus temperature of the Sn—In based alloy.

Second, the inventors found that silver, copper, and zinc doping could lower the yield strength of the Sn—In based alloy, at least in part because doping with these elements may be used to tune the grain sizes of tin and indium to retain a fine grain structure and achieve super plasticity. Third, the inventors found that silver, copper, and zinc doping may improve solder alloy reliability, including improvements in thermal cycling tests, thermal creep resistance and thermal fatigue life.

In embodiments, the doped solder alloy may comprise 1.0-5.0 wt. % of Ag, 0.25-2.0 wt. % of Cu, 0.1-0.5 wt. % of Zn, and preferably 2.0-3.8 wt. % of Ag, 0.5-1.0 wt. % of Cu, 0.1-0.25 wt. % of Zn, to provide the benefits of forming a eutectic SnAgCu phase, and balancing the amount of zinc that increases ductility (or decreases yield strength) while limiting oxidation.

In consideration of the possible oxidation of the zinc and indium dopants, in embodiments a sulfur compound (e.g., $Cu_2S$ or CuS) may be included in a concentration of 100 ppm to 500 ppm in the alloy to prevent oxidation of zinc and indium on the surface of the alloy. In particular implementations, the sulfur compound may be included in a concentration of 200 ppm to 300 ppm in the solder alloy.

EXAMPLES

Figure 2:
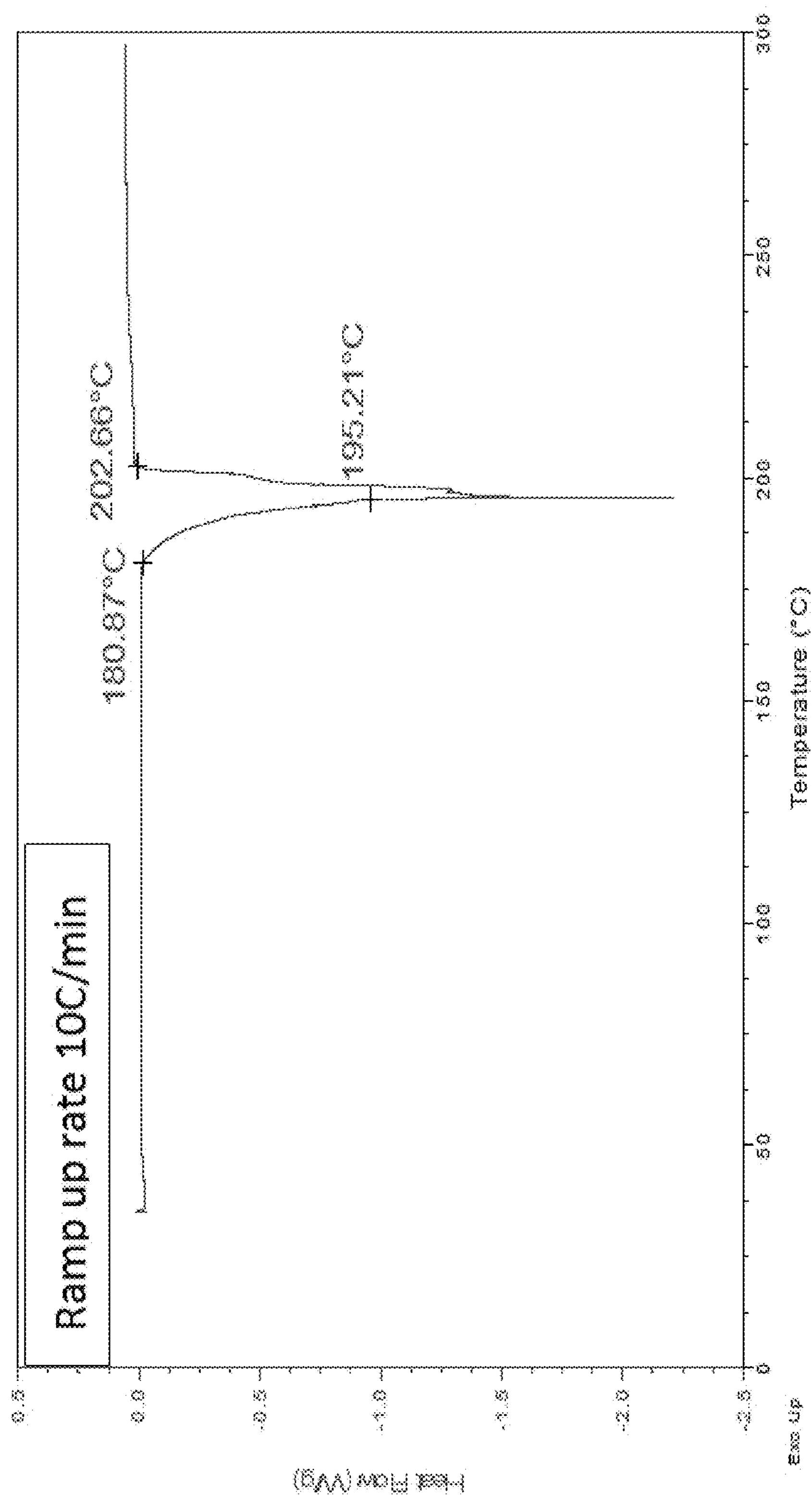
FIG. 2 is a Differential Scanning calorimetry (DSC) graph showing a melting temperature range of a tested Sn—In alloy comprising Ag, Cu, and Zn dopants in accordance with an embodiment of the present disclosure.

FIG. 2 is a Differential Scanning calorimetry (DSC) graph showing a melting temperature range of a tested Sn—In alloy comprising 12.7 wt. % of In, 2.7 wt. % of Ag, 0.5 wt. % of Cu, 0.1 wt. % of Zn, and a remainder of Sn in accordance with an embodiment of the present disclosure. The melting behavior of the alloy was analyzed using DSC with a heating ramp up rate of 10° C./min. DSC tests were performed in a Q2000 differential scanning calorimeter, scanning from room temperature to 300° C. As illustrated by the DSC graph, the solidus temperature of the alloy is about 180.87° C. and the liquidus temperature of the alloy is about 202.66° C. Heat flow peaks at a melting temperature of about 195.21° C.

Figure 3:
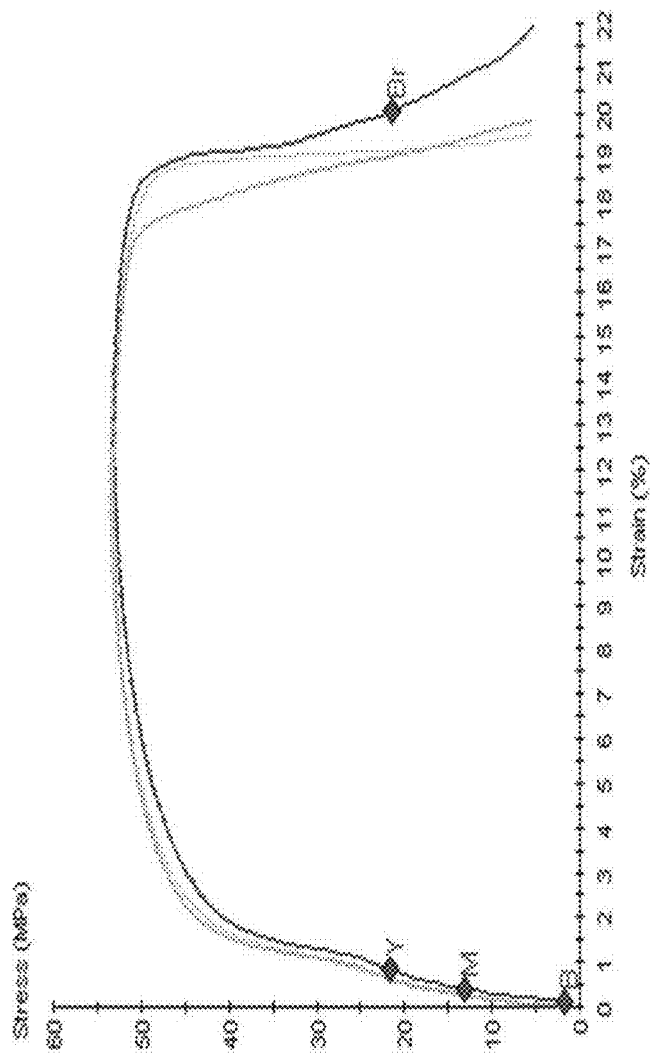
FIG. 3 is a graph showing stress-strain curves of a tested Sn—In alloy comprising Ag, Cu, and Zn dopants in accordance with an embodiment of the present disclosure.

FIG. 3 is a graph showing stress-strain curves of a tested Sn—In alloy comprising 12.7 wt. % of In, 2.7 wt. % of Ag, 0.5 wt. % of Cu, 0.1 wt. % of Zn, and a remainder of Sn in accordance with an embodiment of the present disclosure. The alloy was tested three times at a strain rate of 0.05 in/sec. The measured yield strength, tensile strength, and ductility of the three tests are summarized below in Table 1.

TABLE 1

| No. | Yield, psi | Yield, Mpa | Tensile, ksi | Tensile, Mpa | Ductility, % |
|---|---|---|---|---|---|
| 1 | 3232.00 | 22.28 | 7.7809 | 53.65 | 18.86 |
| 2 | 3145.40 | 21.69 | 7.7205 | 53.23 | 21.15 |
| 3 | 3104.79 | 21.41 | 7.7206 | 53.23 | 19.20 |
| Average | 3160.73 | 21.79 | 7.74 | 53.37 | 19.74 |

The tested alloy exhibited a low yield strength between about 16 MPa and 22 MPa at a strain rate of 0.05 in/sec.

The tested alloy exhibited a low yield strength between about 16 MPa and 22 MPa at a strain rate of 0.05 in/sec.

Process

As noted above, the disclosed solder alloy is suitable for, but not limited to, producing solder joints, in the form of solder preforms, solder balls, solder powder, or solder paste (a mixture of solder powder and flux), for electronics applications. The low melting temperature range (e.g., 180° C. to 205° C.) and low yield strength (e.g., 16 MPa to 22 MPa) of the solder alloy may help minimize semiconductor chip warpage and increase joint reliability, making the solder alloy particularly useful for solder on pad (SoP) applications in first level interconnect (FLI) semiconductor device packaging.

Figure 4:
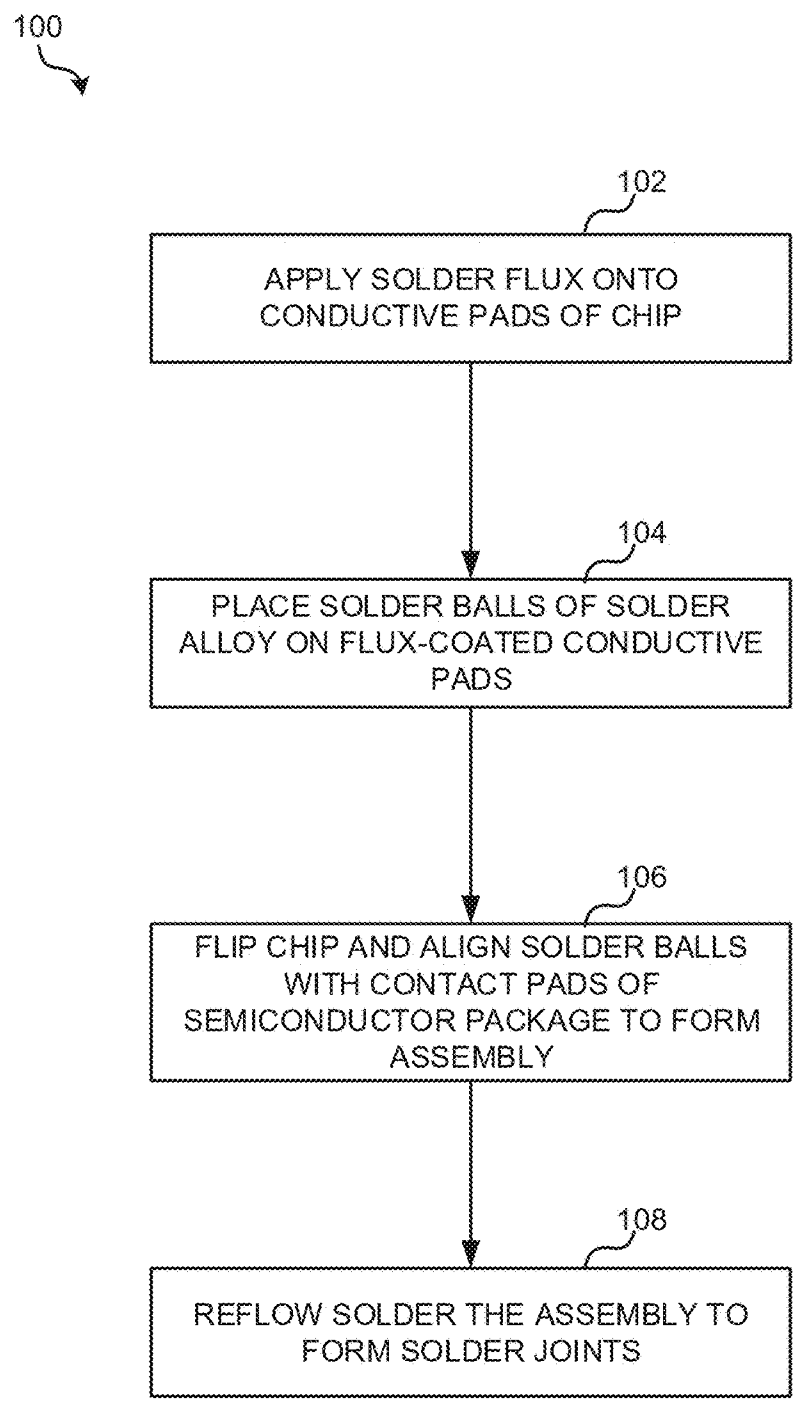
FIG. 4 is an operational flow diagram illustrating an example process of forming FLI solder joints using a solder alloy in accordance with the present disclosure.

FIG. 4 is an operational flow diagram illustrating an example process 100 of forming solder joints using a solder alloy in accordance with the present disclosure. These steps are described in terms of an example application of bump bonding a flip chip to a semiconductor package using the disclosed solder alloy. However, after reading this description one of ordinary skill in the art will appreciate how the solder alloy could be applied to other applications.

Prior to initiating process 100, a substrate with one or more conductive pads may be provided. For example, a chip with metallized (e.g., Cu) or other conductive pads for bump bonding may be provided. At operation 102, a layer of solder flux is applied onto the substrate (e.g., by printing through a stencil or other coating techniques known in the art) such that at least the conductive pads are coated. Next, at operation 104, solder bumps or balls of the disclosed solder alloy are placed on the flux-coated conductive pads. In particular embodiments, the solder balls may comprise 10.0-15.0 wt. % of In, 2.0-3.8 wt. % of Ag, 0.5-1.0 wt. % of Cu, 0.1-0.25 wt. % of Zn, and a remainder of Sn. In various embodiments, the balls can be placed manually or using automated equipment known in the art.

At operation 106, the chip is flipped and the solder balls are aligned with contact pads of a semiconductor package to form an assembly. Then, at operation 108, the assembly is heated through a reflow process to join the solder balls to the metal pads, thereby forming solder joints that establish a first level interconnect between the chip and semiconductor package.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A solder alloy, comprising:
5.0-20.0 wt. % of In;
1.0-5.0 wt. % of Ag;
0.25-2.0 wt. % of Cu;
0.1-0.5 wt. % of Zn; and
a remainder of Sn,
wherein the solder alloy has a yield strength between 15 MPa and 40 MPa.

2. The solder alloy of claim 1, wherein a solidus temperature of the solder alloy is 160° C. or more, and wherein a liquidus temperature of the solder alloy is 210° C. or less.

3. The solder alloy of claim 2, wherein the solidus temperature of the solder alloy is 180° C. or more, and wherein the liquidus temperature of the solder alloy is 205° C. or less.

4. The solder alloy of claim 3, wherein the yield strength of the solder alloy is between 16 MPa and 22 MPa.

5. The solder alloy of claim 1, wherein the solder alloy comprises greater than 12.0 wt. % to 15.0 wt. % In.

6. The solder alloy of claim 5, wherein the solder alloy comprises 2.0 wt. % to 3.8 wt. % Ag.

7. The solder alloy of claim 5, wherein the solder alloy comprises 0.5 wt. % to 1.0 wt. % Cu.

8. The solder alloy of claim 5, wherein the solder alloy comprises 0.1 wt. % to 0.25 wt. % Zn.

9. The solder alloy of claim 5, further comprising: a $Cu_2S$ or CuS sulfur compound, wherein the sulfur compound is present in the solder alloy in a concentration of 100 ppm to 500 ppm.

10. The solder alloy of claim 5, consisting essentially of:
a sulfur compound having a concentration of 100 ppm to 500 ppm in the solder alloy;
greater than 12.0 wt. % to 15.0 wt. % of In;
2.0-3.8 wt. % of Ag;
0.5-1.0 wt. % of Cu;
0.1-0.25 wt. % of Zn; and
a remainder of Sn.

11. A solder joint formed by a process of:
placing a soldering material onto a metal pad of a substrate, wherein the soldering material comprises a solder alloy; and
reflow soldering the substrate to form the solder joint;
wherein the solder alloy comprises:
5.0-20.0 wt. % of In;
1.0-5.0 wt. % of Ag;
0.25-2.0 wt. % of Cu;
0.1-0.5 wt. % of Zn; and
a remainder of Sn,
wherein the solder alloy has a yield strength between 16 MPa and 22 MPa.

12. The solder joint of claim 11, wherein a solidus temperature of the solder alloy is 160° C. or more, and wherein a liquidus temperature of the solder alloy is 210° C. or less.

13. The solder joint of claim 12, wherein the solidus temperature of the solder alloy is 180° C. or more, and wherein the liquidus temperature of the solder alloy is 205° C. or less.

14. The solder joint of claim 11, wherein the solder alloy comprises greater than 12.0 wt. % to 15.0 wt. % In.

15. The solder joint of claim 14, wherein the solder alloy comprises 2.0 wt. % to 3.8 wt. % Ag.

16. The solder joint of claim 14, wherein the solder alloy comprises 0.5 wt. % to 1.0 wt. % Cu.

17. The solder joint of claim 14, wherein the solder alloy comprises 0.1 wt. % to 0.25 wt. % Zn.

18. The solder joint of claim 14, the solder alloy further comprising: a $Cu_2S$ or CuS sulfur compound, wherein the sulfur compound is present in the solder alloy in a concentration of 100 ppm to 500 ppm.

19. The solder joint of claim 14, wherein the solder alloy consists essentially of:

a sulfur compound having a concentration of 100 ppm to 500 ppm in the solder alloy;

greater than 12.0 wt. % to 15.0 wt. % of In;

2.0-3.8 wt. % of Ag;

0.5-1.0 wt. % of Cu;

0.1-0.25 wt. % of Zn; and a remainder of Sn.

20. The solder joint of claim 11, wherein the solder joint provides a first level interconnect between a chip and a semiconductor package.

* * * * *